United States Patent
Chow et al.

(10) Patent No.: US 8,181,336 B2
(45) Date of Patent: May 22, 2012

(54) MICRO-ASSEMBLER

(75) Inventors: Eugene M. Chow, Fremont, CA (US); Jeng Ping Lu, Fremont, CA (US); Meng H. Lean, Santa Clara, CA (US); David K. Biegelsen, Portola Valley, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 80 days.

(21) Appl. No.: 12/754,230

(22) Filed: Apr. 5, 2010

(65) Prior Publication Data

US 2010/0192365 A1 Aug. 5, 2010

Related U.S. Application Data

(62) Division of application No. 12/041,375, filed on Mar. 3, 2008, now Pat. No. 7,861,405.

(51) Int. Cl.
*B23P 19/00* (2006.01)

(52) U.S. Cl. .......... 29/729; 29/739; 29/740; 438/14; 438/106

(58) Field of Classification Search ............ 29/719–721, 29/729, 739, 740, 832–834; 438/14, 51, 438/106; 455/22–25; 347/55, 112, 141, 347/149
See application file for complete search history.

(56) References Cited

U.S. PATENT DOCUMENTS

| | | | |
|---|---|---|---|
| 3,439,416 A | 4/1969 | Yando | |
| 4,194,668 A | 3/1980 | Akyurek | |
| 4,542,397 A | 9/1985 | Biegelsen et al. | |
| 5,034,802 A | 7/1991 | Liedes, Jr. et al. | |
| 5,159,392 A | 10/1992 | Kasahara et al. | |
| 5,355,577 A | 10/1994 | Cohn | |
| 5,545,291 A | 8/1996 | Smith et al. | |
| 5,666,147 A | 9/1997 | Larson | |
| 5,783,856 A | 7/1998 | Smith et al. | |
| 5,824,186 A | 10/1998 | Smith et al. | |
| 5,904,545 A | 5/1999 | Smith et al. | |
| 5,988,794 A | 11/1999 | Takagi | |
| 6,796,867 B2 | 9/2004 | George et al. | |
| 7,035,575 B2 | 4/2006 | Ikeguchi et al. | |
| 7,332,361 B2 | 2/2008 | Lu et al. | |
| 7,861,405 B2 * | 1/2011 | Chow et al. | 29/729 |
| 8,082,660 B2 * | 12/2011 | Lu et al. | 29/739 |
| 2006/0128057 A1 | 6/2006 | Lu et al. | |
| 2010/0186221 A1 | 7/2010 | Chow et al. | |

OTHER PUBLICATIONS

Feb. 13, 2012 Office Action in U.S. Appl. No. 12/754,254.
Mar. 9, 2012 Office Action issued in U.S. Appl. No. 12/754,245.

* cited by examiner

*Primary Examiner* — Minh Trinh
(74) *Attorney, Agent, or Firm* — Oliff & Berridge, PLC (57) ABSTRACT

A xerographic micro-assembler system, method and apparatus that includes a sorting unit that is adapted to receive a plurality of micro-objects. The micro-objects can also be sorted and oriented on the sorting unit and then transferred to a substrate. The system, method and apparatus can also include a device for detecting errors in at least one of the micro-objects on the sorting unit and a protection means for preventing an improper micro-object from being transferred to the substrate. The system, method and apparatus can also include an organized micro-object feeder assembly that can transfer at least one of a plurality of micro-objects to the sorting unit or directly to the substrate.

6 Claims, 7 Drawing Sheets

MICRO-ASSEMBLER

This is a Divisional of application Ser. No. 12/041,375 filed Mar. 3, 2008. The entire disclosure of the prior application is hereby incorporated by reference herein its entirety.

BACKGROUND

The exemplary embodiments relate to aspects of micro-assembly techniques used for fabricating microstructures and microdevices, generally referred to herein as "micro-assemblies."

Micro-assembly fabrication has several different approaches. One approach, which is used to fabricate MEMS micro-assemblies, is referred to as "micromachining." Micromachining utilizes standard semiconductor fabrication techniques (e.g., photolithographic patterning, isotropic/anisotropic etching, planarization, etc.). For example, digital light processors (DLPs) can be readily formed using surface-type micromachining, while pressure sensors and ink-jet printer heads typically use bulk micromachining. Other techniques, such as laser micromachining, wafer bonding, etc., may be combined with standard semiconductor fabrication techniques to enable the fabrication of advanced micro-assemblies, and in particular micro-electromechanical systems (MEMS), via micromachining.

Another technique used to fabricate micro-assemblies involves micro-assembling. Micro-assembling involves arranging very small (e.g., micron-scale) objects with a high degree of precision. One micro-assembling technique is referred to in the art as fluidic self-assembly (FSA). In FSA, devices ("function blocks") ranging in size from 10 microns to several hundred microns and having given shapes are suspended into a liquid to form a slurry. The slurry is poured over the surface of a substrate having recessed portions therein. The recessed portions are sized to match the function blocks. In this manner, the function blocks that have been dispersed in the liquid self-align and engage the recessed portions and become integral with the substrate. Examples of FSA technology are disclosed in U.S. Pat. Nos. 5,545,291, 5,783,856, 5,824,186 and 5,904,545.

Other approaches for fabricating individual electronic components (or generally microstructures) and assembling such structures onto a substrate have been proposed. One such approach is described by Yando in U.S. Pat. No. 3,439,416. Yando describes components or structures placed, trapped, or vibrated on an array of magnets. The magnets include magnetized layers alternating with non-magnetized layers to form a laminated structure. Components are matched onto the array of magnets forming an assembly thereof. However, severe limitations exist on the shape, size, and distribution of the components. For example, the component width must match the spacing of the magnetic layers, and the distribution of components is constrained by the parallel lamination geometry. In addition, self-alignment of the components requires the presence of the laminated structure. Furthermore, the structures disclosed by Yando typically possess millimeter-sized dimensions and are therefore generally incompatible with micron-sized integrated circuit structures.

Another fabrication approach is described in U.S. Pat. No. 5,034,802 (Liebes), and involves mating physical features between a packaged surface mount device and substrate. The assembly process described requires a human or robotics arm to physically pick, align, and attach a centimeter-sized packaged surface mount device onto a substrate. Such a process is limiting because of the need for the human or robotics arm. The human or robotics arm assembles each packaged device onto the substrate one-by-one and not simultaneously, thereby limiting the efficiency and effectiveness of the operation. Moreover, the method uses centimeter-sized devices (or packed surface mount integrated circuits), and has little applicability to the assembly of micron-sized objects.

Another approach described in U.S. Pat. No. 4,542,397 (Biegelsen), involves a method of placing parallelogram-shaped structures onto a substrate by mechanical vibration. Alternatively, the method employs pulsating air through apertures in the support surface (or substrate). A limitation to the method is that it requires an apparatus capable of vibrating the structures, or an apparatus for pulsating air through the apertures. Moreover, the method described relies upon centimeter-sized dies and has little applicability to the assembly of micron-sized objects.

A further approach is described in U.S. Pat. No. 4,194,668 (Akyurek), which discloses an apparatus for aligning and soldering electrode pedestals onto solderable ohmic anode contacts. The anode contacts are portions of individual semiconductor chips located on a wafer. Assembling the structures requires techniques of sprinkling pedestals onto a mask and then electromagnetic shaking of the pedestals for alignment. The method is limited because of the need for a shaking apparatus for the electromagnetic shaking step. In addition, the method also requires a feed surface gently sloping to the mask for transferring electronic pedestals onto the mask. Moreover, the method is solely in context to electrode pedestals and silicon wafers, thereby limiting the use of such method to these structures.

Still another approach is described in U.S. Pat. No. 5,355,577 (Cohn), which discloses assembling integrated circuits onto a substrate through electrostatic forces. The electrostatic forces vibrate particles into a state of minimum potential energy. A limitation with the method includes having to provide an apparatus capable of vibrating particles with electrostatic forces. Moreover, the method of Cohn tends to damage the integrated circuits by mechanically vibrating them against each other. Accordingly the method typically becomes incompatible with a state-of-art microstructures.

U.S. Pat. No. 6,796,867 (George), discloses a web fabrication process for manufacturing light-emitting displays as part of a high-speed, continuous in-line process. In an embodiment of the George disclosure, an electrostatic sheet transfer (EST) process is used to place microcomponents in corresponding sockets. In the context of the George disclosure, the microcomponents are light-emitting devices. The light-emitting devices are charged with one type of charge and are distributed over the oppositely charged substrate. The microcomponents adhere to the sockets because of the charge difference. Those microcomponents that do not form an electrostatic bond with corresponding sockets are removed (e.g., shaken or blown) from the substrate surface. While the process of the George patent is generally able to place microcomponents in the form of light-emitting devices into sockets for the particular application of forming a light panel, it has a number of shortcomings that prevent it from being more generally applicable to forming micro-assemblies by manipulating and assembling micro-objects. In particular, the George process lacks the ability to orient the micro-objects in specific directions. Further, the method is not particularly amenable to efficiently assembling a micro-assembly that utilizes a number of different types of micro-objects.

Figure 8:
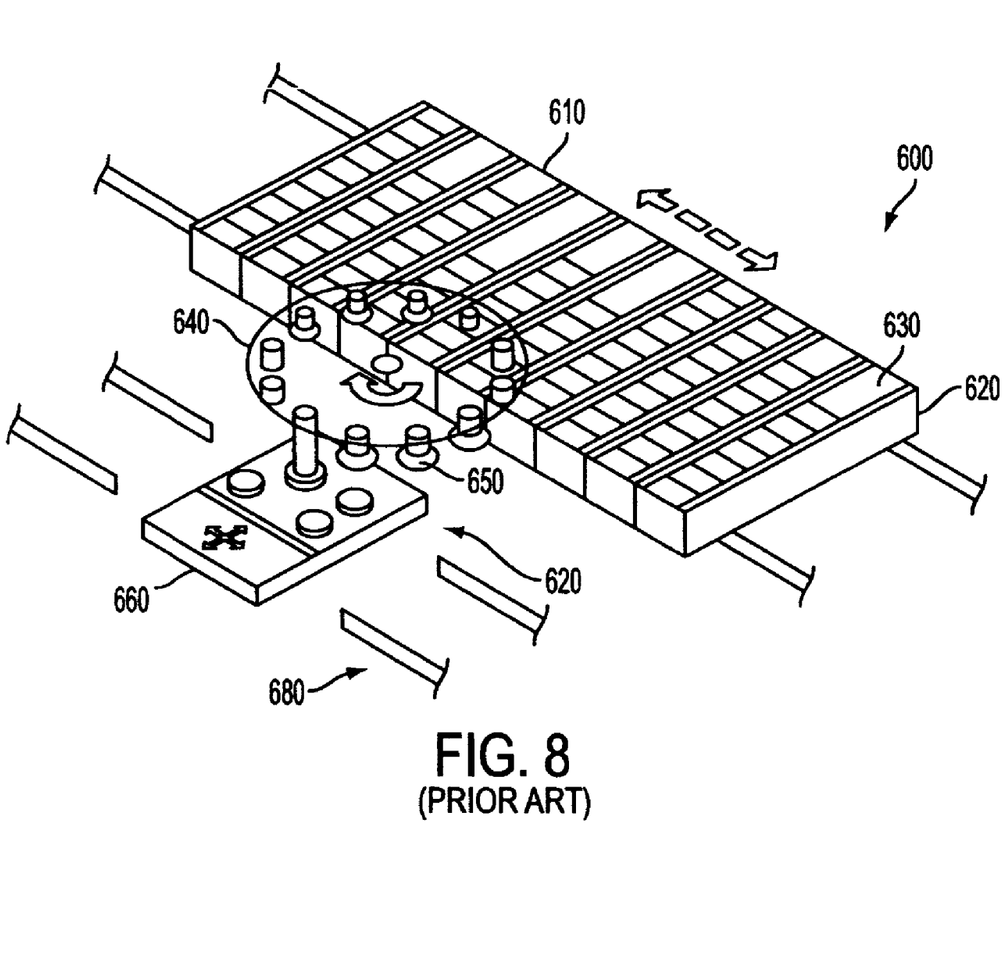
FIG. 8 is a top-view of a related organized micro-object feeder system according to one embodiment.

FIG. 8 illustrates a known micro-object delivery system 600. In this system, a revolving head 640 works together with a plurality of column 620. Each column 620 includes a plurality of chips 630. The revolving head 640 retrieves a micro-object 630 from a column 620 and then transfers the chip to a substrate. The revolving head 640 can also have a plurality of nodes 650. The nodes are able to transfer a chip located in one of the columns 620 and place the chip on substrate 660. The substrate also has a mechanism 670 that enables it to be non-stationary. Proper positioning of the chip on the substrate can be difficult because this system can require the movement of the plurality of columns 620 and the revolving head 640. Movement of the substrate 660 can be required to achieve efficient and strategic placement of the chip on the substrate.

U.S. Patent Publication No. 2006/0128057 (Lu), now U.S. Pat. No. 7,332,361, discloses a micro-assembler system that includes a sorting unit that is capable of electrostatically and magnetically manipulating micro-objects based on a select charge. The sorting unit then transfers the micro-objects to an image transfer unit, which maintains the micro-objects in the sorted and oriented order provided by the sorting unit. The image transfer unit then delivers the micro-objects to a substrate.

SUMMARY

An exemplary embodiment, is a system for forming a micro-assembly. The system includes a means for sorting and orienting a plurality of micro-objects on a sorter that is specially adapted to receive the plurality of micro-objects. The system further includes a means for transferring the sorted and oriented micro-objects from the sorter to a substrate and a means for attaching the micro-objects to the substrate. The system can also further include a second sorter that works together with the first sorter to transfer the micro-objects to the substrate. The sorters can be non-stationary such that the micro-objects move toward the substrate by way of the actual sorters moving. The sorters can also include a non-stationary belt that moves the micro-objects toward the substrate.

Another exemplary embodiment of a system for forming a micro-assembly can include a means for detecting an improper micro-object in at least one of the plurality of micro-objects on the sorter. For example, the means for detecting an improper micro-object could detect micro-objects that have visual defects or are improperly oriented or aligned. The means for detecting an improper micro-object can also be combined with a protection means that prevents a flawed micro-object from being transferred to the substrate or a realignment means for realigning a misaligned micro-object to cure an alignment defect.

Another exemplary embodiment of a system for forming a micro-assembly can include a counter electrode that can help properly align and orient the plurality of micro-objects on the sorter. The counter electrode could be placed above the sorter such that the distance between the sorter and the counter electrode decreases in the direction toward the substrate.

Another exemplary embodiment of a system for forming a micro-assembly can include a plurality of charge encoded micro-objects or magnetic field pattern encoded micro-objects. In this embodiment, it can also be necessary for the sorter to be charge encoded or magnetic field pattern encoded. The system can further include a means for charging and discharging a sorter or individual elements that form the sorter, with an optical pattern writer or by using an electromagnetic array to generate a dynamic reconfigurable magnetic field.

Another exemplary embodiment of a system for forming a micro-assembly can include a means for moving the plurality of micro-objects to the traveling sorter by way of micro-object server assembly. The micro-object server assembly can include at least one transport belt that can transfer the micro-objects to the sorter in an organized manner. The micro-object server can also include a series of parallel transport belts that can selectively move a micro-object to the substrate; thereby the series of transport belts can act as a sorter.

Other exemplary embodiments are an apparatus and method for forming a micro-assembly that includes a sorter adapted to receive, sort, orient and transfer a plurality of micro-objects. The apparatus also includes a detection device for detecting an improper micro-object on a sorter, wherein a protection unit prevents an improper micro-object from being transferred to a substrate.

Other exemplary embodiments are an apparatus and method of forming a micro-assembly that includes sorting and orienting a plurality of micro-objects on a sorter that is adapted to receive the micro-objects, wherein a counter electrode aids in the sorting and orienting of the micro-objects. The apparatus and method further includes transferring the micro-objects from the sorter to a substrate and attaching the micro-objects to the substrate.

Other exemplary embodiments are an apparatus and method of forming a micro-assembly that includes a micro-object server assembly. The assembly can supply a plurality of micro-objects to a sorter or directly to a substrate.

EMBODIMENTS

The systems, methods and apparatus described herein are directed to forming micro-assemblies by assembling micro-objects (i.e., micro-sized components) using electrostatic, magnetic and/or mechanical forces to position and orient the micro-objects in a select relationship to one another on a sorter and later a substrate. A generalized system and apparatus for assembling micro-objects according to the embodiments describe hereafter is described.

The embodiments discussed herein, relate to versatile and customizable approaches for forming micro-assemblies and micro-structures. One example of a micro-assembler is an apparatus that forms micro-assemblies by assembling micro-objects using electrostatic and mechanical forces to position and orient the micro-objects in a select relationship to other micro-objects and components that form a micro-assembly. The systems and methods for forming micro-assemblies, as discussed below, are alternatives to cutting and stamping micro-objects of a particular size and shape and then trying to individually arrange the micro-objects. Through exemplary embodiments, the micro-assembly systems and methods described herein employ xerographic techniques in a unique manner to form the micro-assemblies.

The systems and methods described herein are exemplary embodiments of systems and methods for forming micro-assemblies. The exemplary embodiments include a micro-assembler that fabricates a micro-assembly from a set of one or more micro-objects. An example fabrication process includes the following basic steps:

1) specifying the micro-object's orientation;
2) transporting the micro-objects from a reservoir of micro-objects to a sorter;
3) delivering and interfacing the micro-objects to the substrate; and
4) performing post-processing of the micro-objects and the substrate to form the final micro-assembly.

Figure 1:
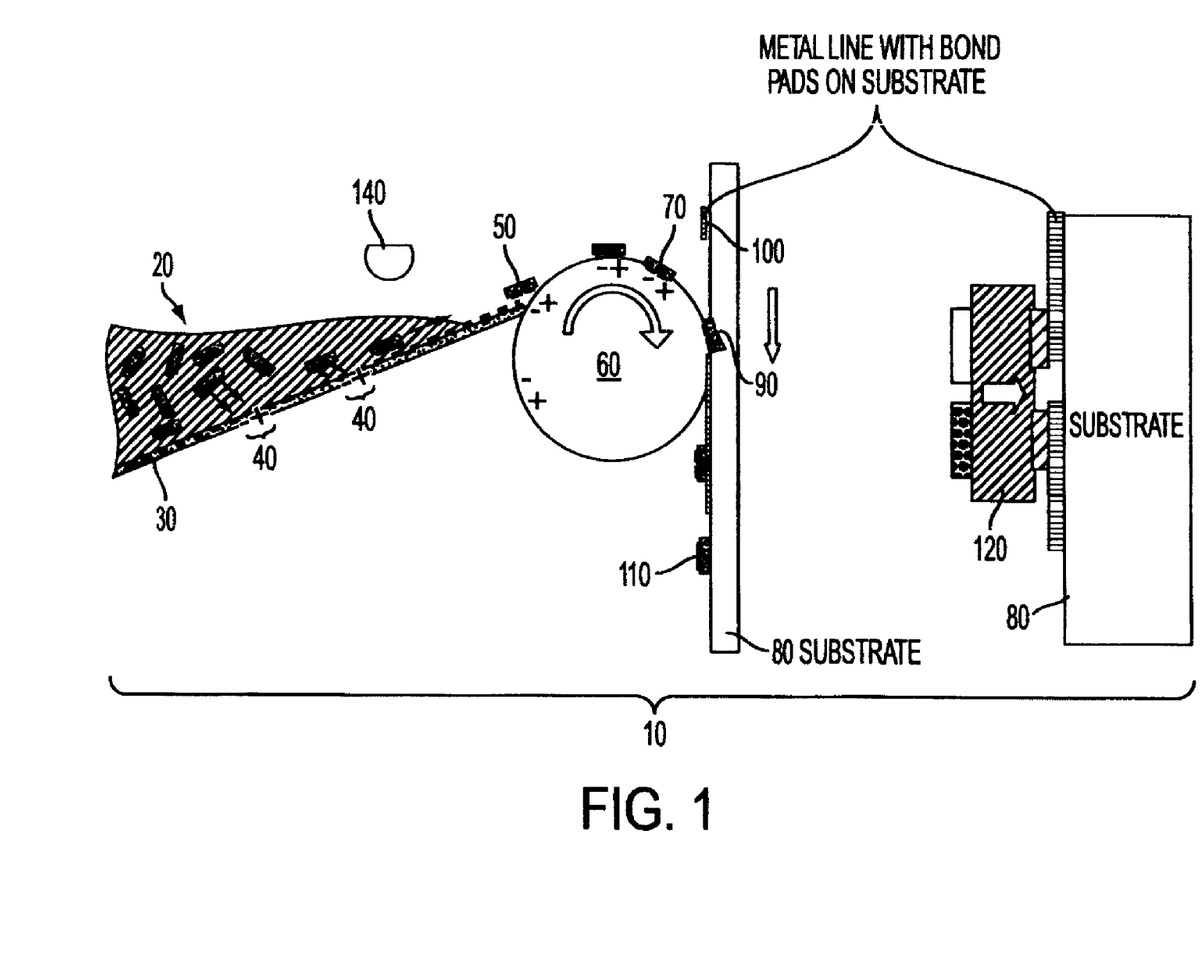
FIG. 1 is a side-view of a micro-assembler system according to one embodiment.

FIG. 1 is a schematic side view of an exemplary embodiment of a micro-assembler. The system for forming micro-assemblies, according to this embodiment, assembles micro-objects using electrostatic forces combined with mechanical forces to position and orient the micro-objects on a substrate. Furthermore, this embodiment requires writing a charge pattern onto the micro-objects. Encoding the micro-objects with a specific charge pattern can aid in the positioning and orienting of the micro-objects for mass sorting and rapid assembly. For example, the charge encoded micro-objects can be charged with a specific pattern that corresponds to a charge pattern that is also encoded on the sorter.

In an embodiment, as shown in FIG. 1, micro-assembler 10 can include a pre-processing unit reservoir 20 where micro-objects, that have already been formed and encoded with a pattern, are stored prior to moving to the micro-assembler system. The micro-objects can be encoded with a charge pattern, a magnetic pattern or any other pattern such that the pattern helps enable proper positioning of the micro-object on the sorter and/or the substrate. In one example, reservoir 20 can be arranged as a bath of micro-objects. Moreover, reservoir 20 can be other techniques commonly used in the field to feed micro-objects into a micro-assembler system.

According to the embodiment shown in FIG. 1, micro-objects are adapted to be able to move from the area referred to as reservoir 20 to the area surrounding transporter 30. Transporter 30, which acts as one component of a sorter, can be a smart conveyer belt with a programmable electric field. In one embodiment, a plurality of regions on the transporter 30 is configured to have a pattern encoded that corresponds with the pattern encoded on at least one of the micro-objects in reservoir 20. In the case of an electrostatic charge pattern, the corresponding charge should be arranged such that at least one micro-object is attracted to a specific charged region 40 on the transporter 30. Therefore, the programmable electrostatic pattern field on the transporter 30 can work together with the corresponding charge pattern of the at least one micro-object in order to arrange micro-objects in a predetermined position on the transporter 30. Transporter 30 can be a traveling belt that is capable of moving at least one properly positioned micro-object 50 onto a photoconductor 60, which acts as a sorter in conjunction with transporter 30. In one embodiment, as shown in FIG. 1, the photoconductor 60 is cylindrical shaped.

The photoconductor 60 is adapted to be able to receive the micro-object 50 from transporter 30. When the micro-object 50 is transferred to the photoconductor 60 it is either directly or indirectly in contact with the photoconductor 60. A properly aligned micro-object 70 on the photoconductor can be in direct or indirect contact with the photoconductor 60. The photoconductor 60 can also be charge encoded or magnetic field pattern encoded to better enable alignment and positioning of at least one micro-object on the photoconductor 60. Therefore, the photoconductor system can further include a means for charging and discharging the photoconductor 60 with an optical pattern writer or by using an electromagnetic array to generate a dynamic reconfigurable magnetic field. In the alternative, the photoconductor 60 can be arranged with a laser for writing a charge pattern on the photoconductor. For example, a laser printer ROS can be used to write a charge pattern on the surface of the photoconductor 60. An example charge pattern is shown in FIG. 1.

By way of the transporter 30 and photoconductor 60, the micro-assembly system shown in FIG. 1, can be configured to transfer at least one micro-object to a substrate 80. Transfer of the properly aligned micro-object 70 on the photoconductor 60 to the substrate 80 occurs at transfer region 90. The substrate 80 can also be adapted to have metal lines with bond pads 100, such that the substrate 80 is specially adapted to receive micro-objects. The substrate 80 of the micro-assembler system, as shown in FIG. 1, can be non-stationary. Use of a non-stationary substrate 80 can further aid in achieving proper positioning of the micro-object on the substrate 80 in an efficient and precise manner. After transfer of the properly aligned micro-object 70 on the photoconductor 60 to the substrate 80 occurs, at contact region 90, proper placement of the substrate is achieved to form an embedded micro-object 110.

As shown in FIG. 1, the embedded micro-object 110 can be aligned on the substrate on metal lines already present on the substrate for connection of the micro-objects. Before placing the micro-object on the substrate or metal line, it may be necessary to flip the chip from its original configuration. Therefore, a charge or magnetic pattern can be written on both sides of the micro-object to enable proper placement of the micro-object on the substrate. Solder 120 can also be used to achieve secure positioning of the embedded micro-object 110 on the substrate 80. The solder 120 could be positioned on either the micro-object or the substrate, prior to bringing the micro-object and substrate into direct contact in order to achieve proper placement of the micro-object on the substrate. Furthermore, heat, pressure and adhesives can be used individually or in any combination to secure the micro-object on the substrate.

Figure 2:
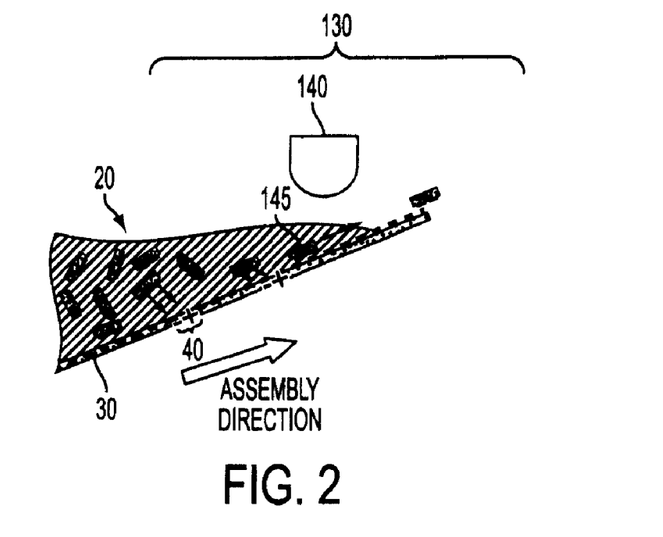
FIG. 2 is a side-view of an improper micro-object detection strategy according to one embodiment.

As shown in FIG. 2, the embodiment shown in FIG. 1 can also be adapted to have an improper micro-object detection assembly 130. The improper micro-object detection assembly 130 can be used to detect at least one fault commonly associated with micro-objects and micro-assemblies. For example, the improper micro-object detection assembly 130 can be adapted to detect faulty micro-objects or micro-objects that do not belong in the micro-assembly ultimately being formed. Specifically, faults the improper micro-object detection assembly could detect include, but are not limited to, a misaligned micro-object, visual defects like an improper size or shape, a misoriented micro-object, a micro-object that is flipped over such that the proper side is not facing in the correct direction, and an incorrect micro-object or that the micro-object is in the incorrect place.

An exemplary embodiment of the defect detection assembly 130 is shown in FIG. 2. FIG. 2 shows an embodiment of the improper micro-object detection assembly, as associated with the structure of a micro-assembly system, as discussed above in relation to FIG. 1. FIG. 2 shows the improper micro-object detection assembly in relation to one embodiment of a micro-assembler. The improper micro-object detection assembly 130 described herein can be used in different embodiments of micro-assembly systems.

Specifically, the defect detection assembly 130 can include a camera 140 that can be adapted to detect a defect in at least one of the plurality of pattern encoded micro-objects. The camera 140 could use image recognition software to adequately identify an improper micro-object 145 and can be adapted to send information regarding a fault in at least one of the plurality of micro-objects to the transporter 30. Thereafter, a protection means (not shown) can be used to prevent a micro-object that has been identified as improper from reaching the substrate. The protection means can incorporate at least one of a variety of different means to prevent a micro-object that has been identified by the improper micro-object detection assembly 130 as defective, from being placed in a micro-assembly.

In one exemplary embodiment, the improper micro-object detection assembly 130 could incorporate a protection means that includes an improper micro-object removing means. The improper micro-object removing means can act to remove all the micro-objects in the region surrounding a faulty micro-object. For example, the defective micro-object removing means can blow all the micro-objects in the area off the transporter 30. In another example, the improper micro-object removing means could send a travel wave pattern to remove the improper micro-object from the transporter 30 or the photoconductor 60. Therefore, the improper micro-object and the micro-objects surrounding the micro-object identified as improper could be prevented from reaching contact area 90. Such that, the protection means could prevent the defective micro-object from being placed in the micro-assembly.

In another exemplary embodiment of an improper micro-object detection assembly 130, the protection means could include a realignment means that acts to realign a misaligned defective micro-object. For example, the realignment means could incorporate an algorithm to control the electric or magnetic field patterns of transporter 30 to enable rotation, shifting and/or flipping of a micro-object. The protection means discussed above are exemplary embodiments of protection means. Other means could be used in order to prevent a micro-object that has been detected by the improper micro-object detection assembly 130, from becoming incorporated into a micro-assembly. The protection means discussed above can be used individually or in any combination thereof to form the protection means associated with the improper micro-object detection assembly 130.

The type and number of improper micro-object detection assemblies that can be used in a system that forms micro-assemblies can depend on whether the micro-assembly being formed has been designed to be defect tolerant. The more defect tolerant a micro-assembly is, the less necessary it is to incorporate an improper micro-object detection assembly into the micro-assembler system. Moreover, devices can be designed to accept defects in a micro-assembly. Therefore, micro-assemblies designed for devices that are defect tolerant, require less of an intensive improper micro-object detection assembly. Furthermore, it might also not be necessary to use more than one protection means for micro-assemblies being used in devices designed to be defect tolerant. An example of a defect tolerant micro-assembly are ones that act as memory. Micro-assemblies used as memory do not require 100% yield or electrical connection.

Figure 3:
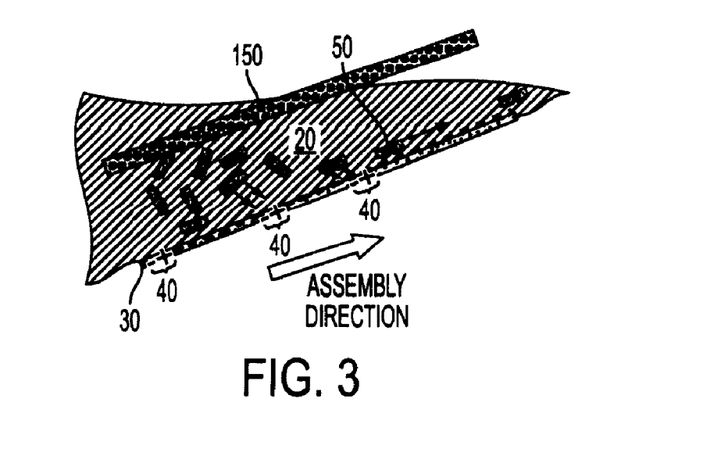
FIG. 3 is a side-view of a sorter according to one embodiment.

To further prevent misalignment of a micro-object, one embodiment of a micro-assembler system could include a counter electrode 150, as shown in FIG. 3. FIG. 3 shows a counter electrode 150 in relation to the embodiment of a micro-assembly system as shown in FIG. 1. The counter electrode 150 can be used in other embodiments of a micro-assembly system. Specifically, the counter electrode 150 can be used in conjunction with a micro-assembly system that incorporate a belt like structure that acts to receive micro-objects, for sorting and orientating, before final placement of the micro-object on a substrate occurs.

The counter electrode 150 can be positioned above a transporter 30, which can act as a sorter. In one arrangement, the counter electrode 150 could be parallel to the belt 30. In another embodiment, as shown in FIG. 3, the counter electrode 150 can be arranged at an angle, such that the distance between the counter electrode transporter decreases in a direction toward the substrate. For example, as shown in FIG. 3A, the counter electrode 150 can be angled such that the distance between the counter electrode 150 and transporter 30 decreases as the transporter 30 approaches the photoconductor 60. The counter electrode 150 can further aid in the sorting and orienting of the plurality of micro objects on the transporter or sorter.

Figure 4:
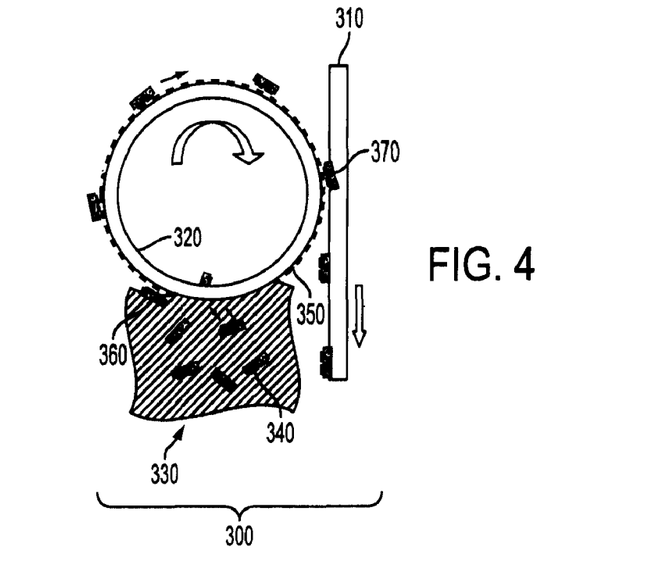
FIG. 4 is a side-view of a sorter according to one embodiment.

In a second embodiment of a micro-assembly system, the sorter can be arranged such that there is a traveling wave grid on the sorter. As shown in FIG. 4, the traveling wave grid micro-assembler system 300 can be configured to transfer a micro-object to a substrate 310. In one embodiment, as shown in FIG. 4, the traveling wave grid micro-assembler system 300 includes a sorter 320, that acts as a sorter as discussed in relation to the first embodiment, which is cylindrical shaped. The assembler system 300 can also be configured such that the sorter 320 is a belt. A sorter that is in a belt configuration can be arranged in a manner that is similar to the belt 30 in the first embodiment, as shown in FIG. 1. Furthermore, in the belt configuration the sorter can also include a counter electrode, as shown in FIG. 3, to aid in the sorting and positioning of micro-objects. In either the cylindrical configuration or the belt configuration, as discussed above, the sorter 320 can incorporate individual or a combination of the various embodiments of the defect detection assembly 130.

The traveling wave grid micro-assembler system 300, as shown in FIG. 4, includes a sorter 320 that incorporates use of a reservoir 330 containing micro-objects 340. Therefore, micro-objects 340 move from reservoir 330 to the sorter 320. sorter 320 has a first surface that includes an electric field wave pattern 350. The wave pattern 350 corresponds to a wave pattern on micro-object 340, such that it can receive the micro-object 340. A micro-object attached to the sorter 360 can then travel on the non-stationary sorter 320 to the substrate 310.

The micro-object attached to the sorter 360 can than be transferred to the substrate 310 at contact region 370. Additionally, a force can be applied at the contact region 370 to aid in the transfer of micro-object attached to the sorter 360. The force can be applied in a direction normal to the surface of the sorter at the contact region 370. As discussed above in relation to the first embodiment, substrate 310 can also be non-stationary such as to aid in the proper placement of micro-object 360 on the substrate.

Figure 5:
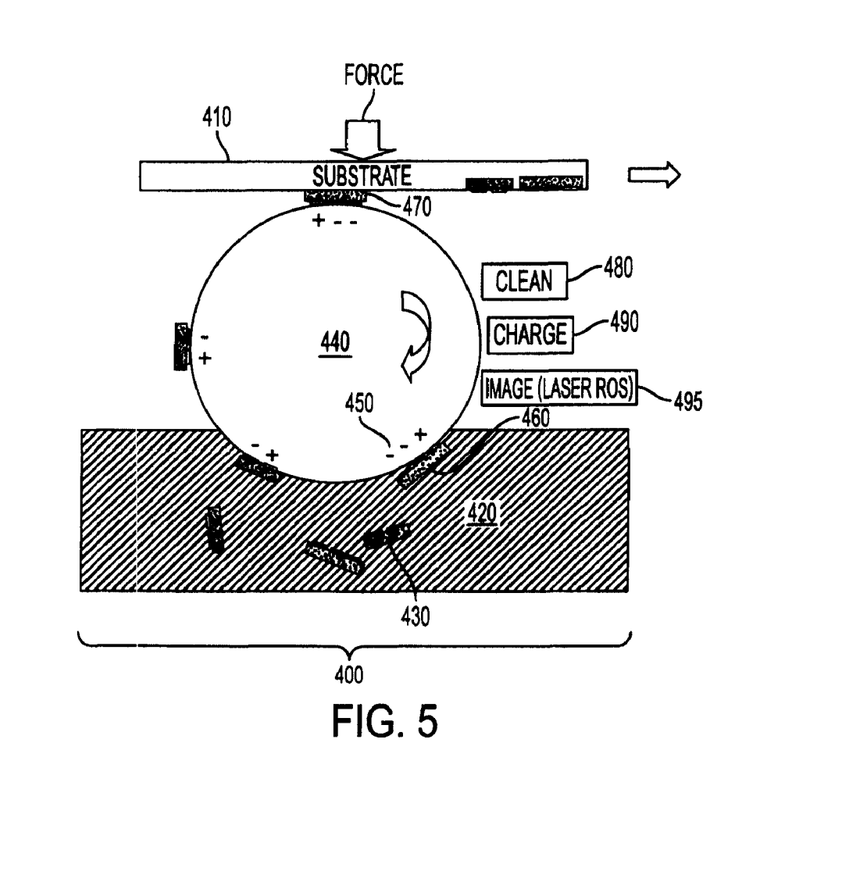
FIG. 5 is a side-view of a sorter according to one embodiment.

In one embodiment of the micro-assembler system, as shown in FIG. 5, the system can be arranged such that there is a traveling static image on a cylinder or belt. FIG. 5 illustrates the cylindrical embodiment; however, the following description can also related to an embodiment using a belt configuration, or any configuration that can hold, change, and transfer micro-objects as described herein. Traveling state image micro-assembler system 400 can be configured to form a micro-assembly on substrate 410. System 400 includes a reservoir 420 that holds micro-objects 430. Micro-objects 430 can be charge-encoded to correspond with the sorter 440, which acts as a sorter as discussed in relation to the embodiment of FIG. 1.

As shown in FIG. 5, the sorter 440 has a charged region 450 that corresponds to at least one micro-object 430. Therefore, micro-object 430 can be attracted to the charged region 450 on the non-stationary sorter 440. A micro-object attached to the sorter 440 can then travel, on the non-stationary sorter 440, toward the substrate 410. The sorter 440 can then transfer micro-object 460 to the substrate 410 at contact area 470. A force can be applied, either on the substrate side or on the side of the sorter, to aid in the transfer of the micro-object.

In this embodiment the micro-assembler system operates in a manner similar to a xerographic printing/copying machine. Specifically, this system uses static charge image writing to hold and position micro-objects on the traveling receptor. The system also includes a means for cleaning the static image charge 480. The system further includes, a charge applying means 490 that is capable of applying the appropriate charge pattern to the sorter 440. This may require an image writing means 495, which could be a laser mechanism that uses a raster output scanner. Therefore, this embodiment of a micro-assembler system could incorporate the technology associated with xerographic printing machines.

The embodiments for a micro-assembler system, as discussed above, can incorporate use of a sorter that is charge encoded. There are many ways known by a person skilled in the art as to how to obtain the proper charge pattern on the charge encoded sorter and charge encoded micro-objects.

Figure 6:
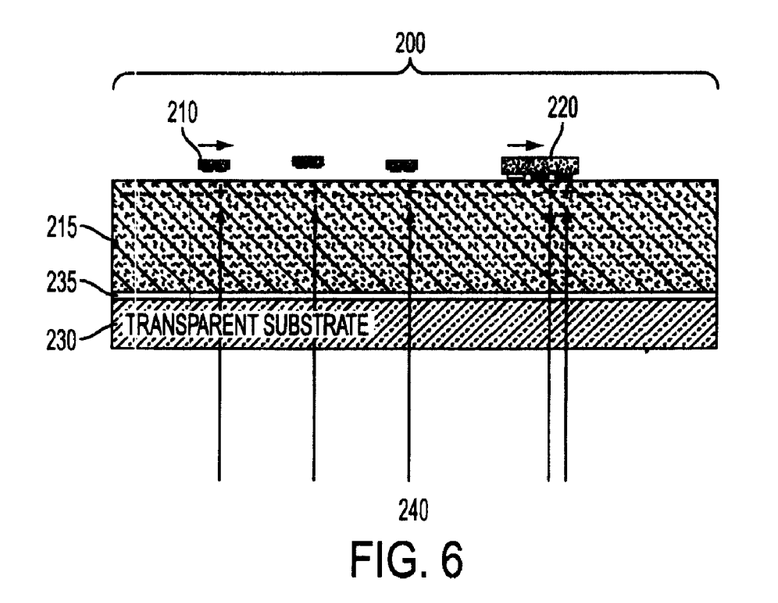
FIG. 6 is a side-view of a sorter according to one embodiment.

However, an exemplary embodiment uses an advanced address sorter system 200 that is not known in the art, as illustrated in FIG. 6. The address sorter system 200 uses light to optically pattern charge repeatedly, after being erased, creating a video of charge images which acts as a traveling wave pattern. Specifically, as shown in FIG. 6, the advanced address sorter system 200 can include a photoconductor 210 positioned over a transparent substrate 230. Transparent substrate 230 is made of a material that will enable laser light from an optical pattern writer 240 to pass through the transparent electrode 230. Positioned between the transparent substrate 230 and the photoconductor 210 is electrode 235. Electrode 235 has an alternating voltage which continually discharges and recharges the charge on the surface of the photoconductor 210. The optical pattern writer 240 is synchronized to discharge the charge on the surface of the photoconductor 210. Furthermore, this process of writing and erasing a charge pattern on the photoconductor 210 can be repeated with different static charge patterns to create a traveling wave charge pattern. Another term for this approach is, creating shifted images to create the traveling wave charge pattern.

In the embodiments for a micro-assembler system discussed above, the micro-objects are transferred to the sorter from a reservoir. One example of a type of reservoir commonly used in the field is a bath of micro-objects. However, reservoirs for micro-objects are not limited to this embodiment.

Figure 7A:
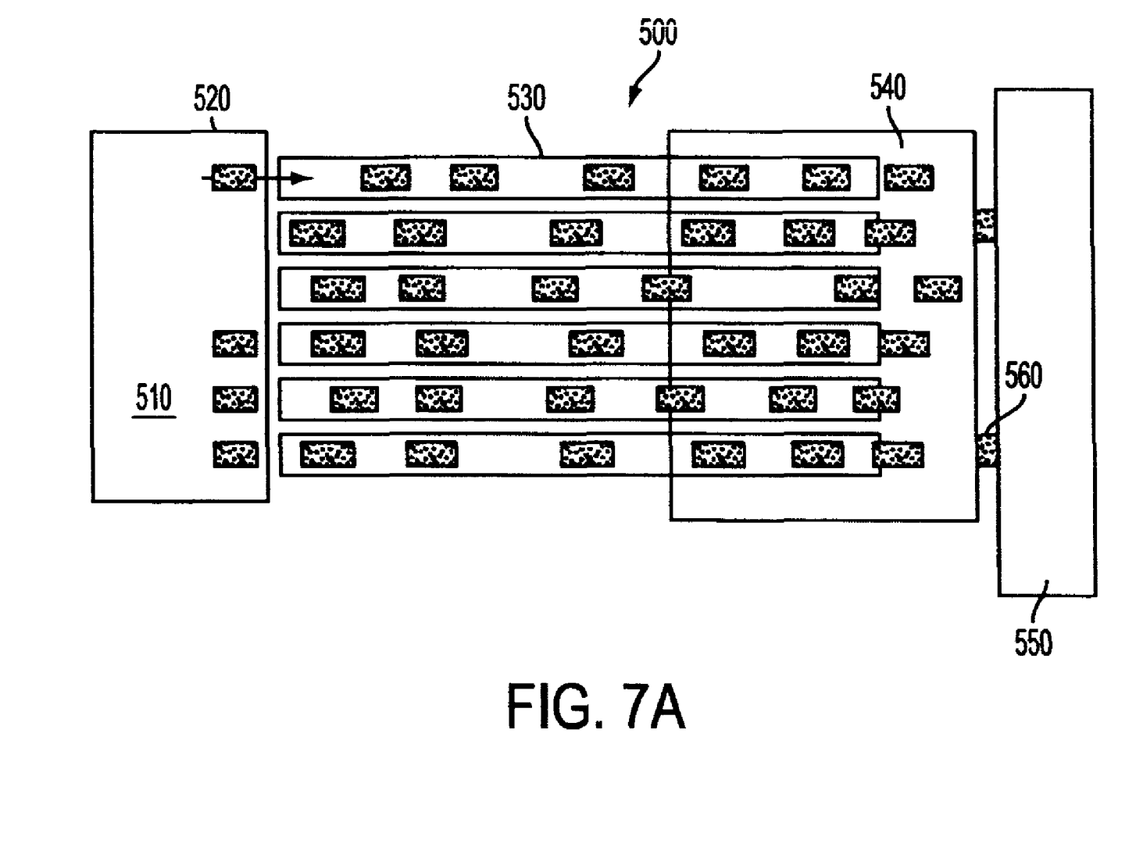
FIG. 7*a* is a top-view of an organized micro-object feeder system according to one embodiment.
Figure 7B:
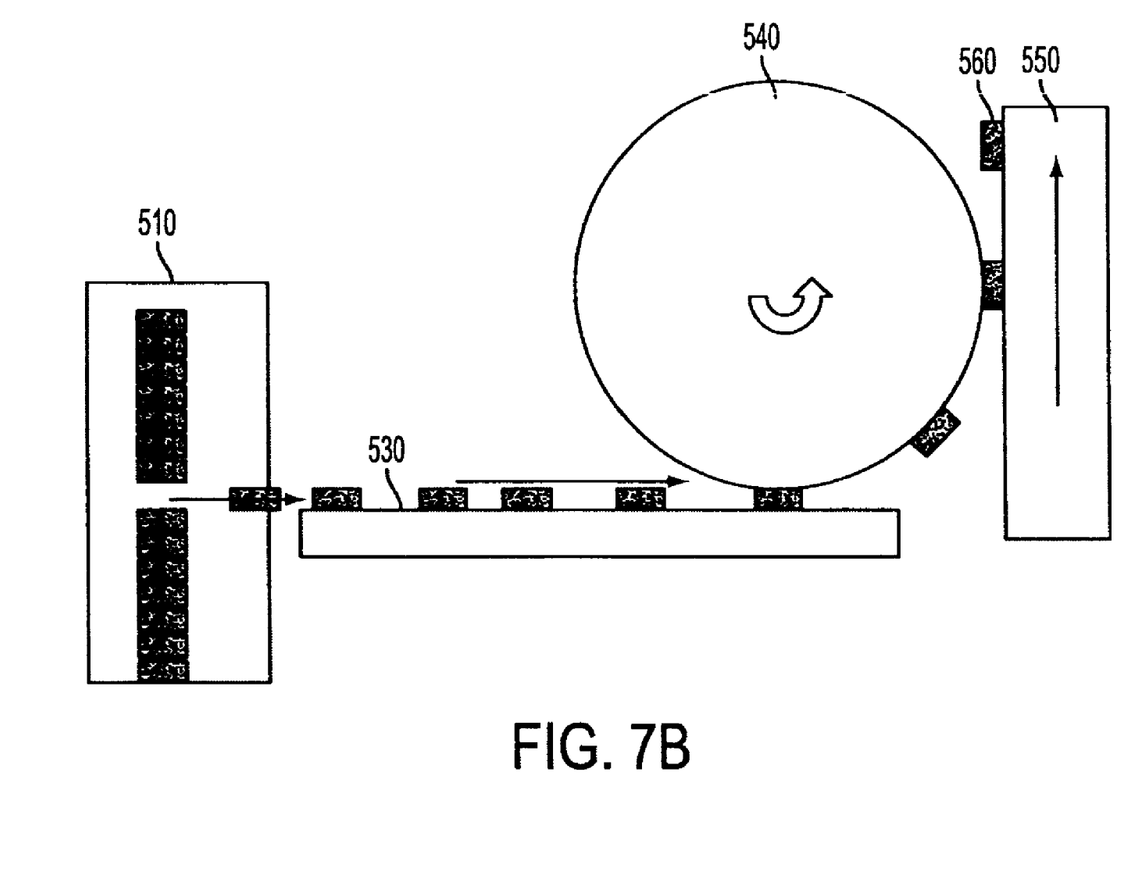
FIG. 7*b* is a side-view of an organized micro-object feeder system according to one embodiment.

An exemplary embodiment of a micro-assembler system can incorporate use of a more organized and efficient reservoir. As shown in FIGS. 7a and 7b, an organized micro-object feeder system 500 could be used. The organized micro-object feeder system 500 can include a micro-object server 510 that feeds at least one of a plurality of micro-objects 520 into at least one transporter column 530. In the embodiment shown in FIG. 7a, there are a plurality of parallel transporter columns 530 that receive at lease one micro-object from micro-object server 510. In this arrangement each transporter 530 can also act as a sorter that can receive a plurality of micro-objects. Each transporter 530 can be timed to release a micro-object such that it can be transferred to the substrate 550 at the appropriate time. Once the micro-object is transferred to the contact region 540, which is arranged in relation to the output of each respective transporter belt, the micro-object comes into contact with the substrate 550. Once the micro-object is in contact with the appropriate contact region 540 of the substrate 550, an embedded micro-object 560 is formed.

In the embodiment of an organized micro-object feeder system 500 shown in FIG. 7b, the micro-object server 510 feeds at least one of a plurality of micro-objects 520 to one transporter column 530. The transporter 530 can be in a belt configuration, as shown in FIG. 7b. The transport belt 530 can then transfer at least one micro-object to a sorter 540, which transfers the micro-object to the substrate 550. This embodiment also results in an embedded micro-object 560.

It will be appreciated that variations of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A system of forming a micro-assembly comprising:
   means for transferring a plurality of micro-objects to a sorting unit adapted to receive the micro-objects including:
      a micro-object feeder assembly that contains a plurality of organized micro-objects; and
   means for transferring the micro-objects from the sorting unit to a substrate, wherein
   the micro-object feeder assembly includes,
   a micro-object holder that contains the plurality of organized micro-objects; and
   a transporter having at least one column that receives at least one of the plurality of organized micro-objects from the micro-object holder.

2. The system of claim 1, wherein the at least one column is a belt.

3. The system of claim 1, wherein the transporter has a plurality of columns configured to sort the micro-objects.

4. The system of claim 2, wherein the at least one column in the micro-object feeder assembly transfers at least one of the plurality of organized micro-objects to a substrate.

5. The system of claim 1, further comprising a traveling sorter that transfers the at least one of the plurality of organized micro-objects from the at least one column to the substrate.

6. The system of claim 5, wherein the traveling sorter is cylindrically shaped.

* * * * *